(12) United States Patent
Huang et al.

(10) Patent No.: US 11,177,858 B2
(45) Date of Patent: Nov. 16, 2021

(54) ELECTRONIC DEVICE

(71) Applicant: PEGATRON CORPORATION, Taipei (TW)

(72) Inventors: Chin-Ting Huang, Taipei (TW); Sony Chayadi, Taipei (TW); Chun-Kai Wang, Taipei (TW); Hsi-Kai Hung, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 16/909,507

(22) Filed: Jun. 23, 2020

(65) Prior Publication Data

US 2021/0058112 A1 Feb. 25, 2021

(30) Foreign Application Priority Data

Aug. 19, 2019 (TW) .................. 108129469

(51) Int. Cl.
*H04B 5/00* (2006.01)
*H03K 17/955* (2006.01)
*H04W 4/80* (2018.01)

(52) U.S. Cl.
CPC ......... *H04B 5/0012* (2013.01); *H03K 17/955* (2013.01); *H04B 5/0031* (2013.01);
(Continued)

(58) Field of Classification Search
CPC ......... H03K 17/955; H03K 2017/9602; H03K 2017/9606; H03K 2217/960755;
(Continued)

(56) References Cited

U.S. PATENT DOCUMENTS 9,723,434 B1 8/2017 Chang et al.
2014/0176447 A1* 6/2014 Alameh ............ H04M 1/72454
345/173

(Continued)

FOREIGN PATENT DOCUMENTS

EP 3197061 A2 7/2017
TW 201427173 A 7/2014
TW 201429181 A 7/2014

*Primary Examiner* — Tan H Trinh
(74) *Attorney, Agent, or Firm* — Li & Cai Intellectual Property (USA) Office

(57) ABSTRACT

The present invention discloses an electronic device including a body and an insulation housing. The inner side of the insulating housing is provided with a near field communication antenna and a capacitive proximity sensing board adjacent to each other . . . . A side of the near field communication antenna opposite the other side of the near field communication antenna facing the insulating housing is provided with a conductive sheet, and a first insulation layer is disposed between the near field communication antenna and the conductive sheet to be electrically isolated from each other. An area of the conductive sheet is greater than an area of the near field communications antenna. A side of the capacitive proximity sensor pad, opposite the other side of the capacitive proximity sensor pad facing the insulation housing, is provided with a second insulation layer. When the insulation housing is fixed on the body, the near field communications antenna and the capacitive proximity sensor pad are electrically connected to a near field communications antenna processing module and a capacitive proximity sensing module disposed on the body. Through disposition of the conductive sheet, the capacitive proximity sensor pad is less likely to be interfered with a signal emitted by the near field communications antenna.

10 Claims, 10 Drawing Sheets

(52) U.S. Cl.
CPC ............ *H04B 5/0081* (2013.01); *H04W 4/80* (2018.02); *H03K 2217/960755* (2013.01)

(58) Field of Classification Search
CPC .. H04B 5/0012; H04B 5/0031; H04B 5/0081; H04W 4/80
USPC ............. 455/41.1, 575.5, 575.6, 575.7, 41.2; 345/173
See application file for complete search history.

(56) References Cited

U.S. PATENT DOCUMENTS

| | | | |
|---|---|---|---|
| 2015/0333802 A1 | 11/2015 | Yang et al. | |
| 2016/0127523 A1* | 5/2016 | Rouaissia | H04M 1/0266 455/566 |
| 2018/0088690 A1* | 3/2018 | Seo | H01F 7/0294 |
| 2019/0196560 A1* | 6/2019 | Cha | H04M 1/0279 |
| 2019/0320253 A1* | 10/2019 | Park | H04R 1/021 |
| 2020/0045826 A1* | 2/2020 | Wang | G06F 1/1626 |
| 2020/0093040 A1* | 3/2020 | Yun | H05K 1/023 |
| 2020/0350682 A1* | 11/2020 | Kim | H01Q 1/364 |
| 2021/0099560 A1* | 4/2021 | Kim | H05K 1/181 |

\* cited by examiner

ELECTRONIC DEVICE

CROSS-REFERENCE TO RELATED APPLICATIONS

This Non-provisional application claims priority under 35 U.S.C. § 119(a) on Patent Application No(s). TW108129469 filed in Taiwan, Republic of China on 2019 Aug. 19, the entire contents of which are hereby incorporated by reference.

BACKGROUND

Technical Field

The present invention relates to an electronic device, and in particular, to an electronic device including both a near field communications (NFC) antenna and a capacitive proximity sensor pad.

Description of Related Art

To provide better use experience for users and prevent the users' health from being affected by electromagnetic waves emitted by wireless communications modules, most existing electronic devices are provided with a sensor inside for sensing whether a human body is too close. When a human body is too close to an electronic device, a related sensor correspondingly generates a sensing signal, and a related processing unit in the electronic device adjusts intensity of an electromagnetic wave emitted by a wireless communications module according to the sensing signal, thereby protecting the health of users.

To meet requirements of users, the sizes of electronic devices become increasingly smaller. Therefore, a problem that an antenna and a sensor disposed in an electronic device interfere with each other may arise, and consequently, the sensor is likely to make a misjudgment. When a sensor senses that a user is approaching, a related processing unit correspondingly controls operation of a wireless communications module, to reduce the performance of the wireless communications module.

For a user, when the sensor makes a misjudgment, it would be easy to feel degradation of wireless communication performance, resulting in poor use experience. Therefore, for a relevant manufacturer, how to prevent a sensor from making mistakes and keep the size of an electronic device small become one of the problems that urgently need be resolved.

SUMMARY

The present invention discloses an electronic device, mainly configured to alleviate a problem that an internal sensor of an existing small-sized electronic device is likely to be interfered with by a signal emitted by an adjacent antenna and consequently makes a misjudgment.

An embodiment of the present invention discloses an electronic device including: a body, an insulation housing, an NFC antenna, a first insulation layer, a capacitive proximity sensor pad, a second insulation layer, and a conductive sheet. The body includes a circuit board. The insulation housing is capable of being assembled on a side of the body, where the insulation housing includes an inner side surface facing the circuit board and an outer side surface opposite the inner side surface. The NFC antenna is disposed on the inner side surface of the insulation housing. When the insulation housing is assembled on the body, the NFC antenna is electrically connected to the circuit board. The first insulation layer is disposed on a side of the NFC antenna, opposite the other side of the NFC antenna facing the insulation housing. The capacitive proximity sensor pad is disposed on the inner side surface of the insulation housing and is adjacent to the NFC antenna. When the insulation housing is assembled on the body, the capacitive proximity sensor pad is electrically connected to the circuit board. The second insulation layer is disposed on a side of the capacitive proximity sensor pad, opposite the other side of the capacitive proximity sensor pad facing the insulation housing. The conductive sheet is disposed on a side of the first insulation layer, opposite the other side of the first insulation layer facing the NFC antenna. When the insulation housing is assembled on the body, the conductive sheet is electrically connected to a grounded portion of the circuit board. An area of the conductive sheet is greater than an area of the NFC antenna. The conductive sheet is configured to reduce interference between the NFC antenna and the capacitive proximity sensor pad.

Based on the foregoing, in the electronic device of the present invention, through disposition of the conductive sheet, a problem that the capacitive proximity sensor pad is interfered with by a pulse signal emitted by the NFC antenna and makes a misjudgment can be greatly alleviated.

For further understanding of the features and technical content of the present invention, refer to the following detailed description of the present invention and accompanying drawings. However, the description and the accompanying drawings are only provided for describing the present invention, and are not intended to impose any limitation on the protection scope of the present invention.

DETAILED DESCRIPTION

In the following description, the wording, for example, referring to a specific drawing or as shown in a specific drawing, is merely used to emphasize that in the subsequent description the described content is mostly present in the specific drawing, but is not intended to limit that the specific drawing can be only referred to the subsequent description.

Figure 1:
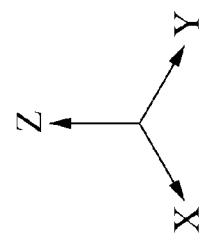
FIG. 1 is a schematic diagram of an electronic device of the present invention.
Figure 1:
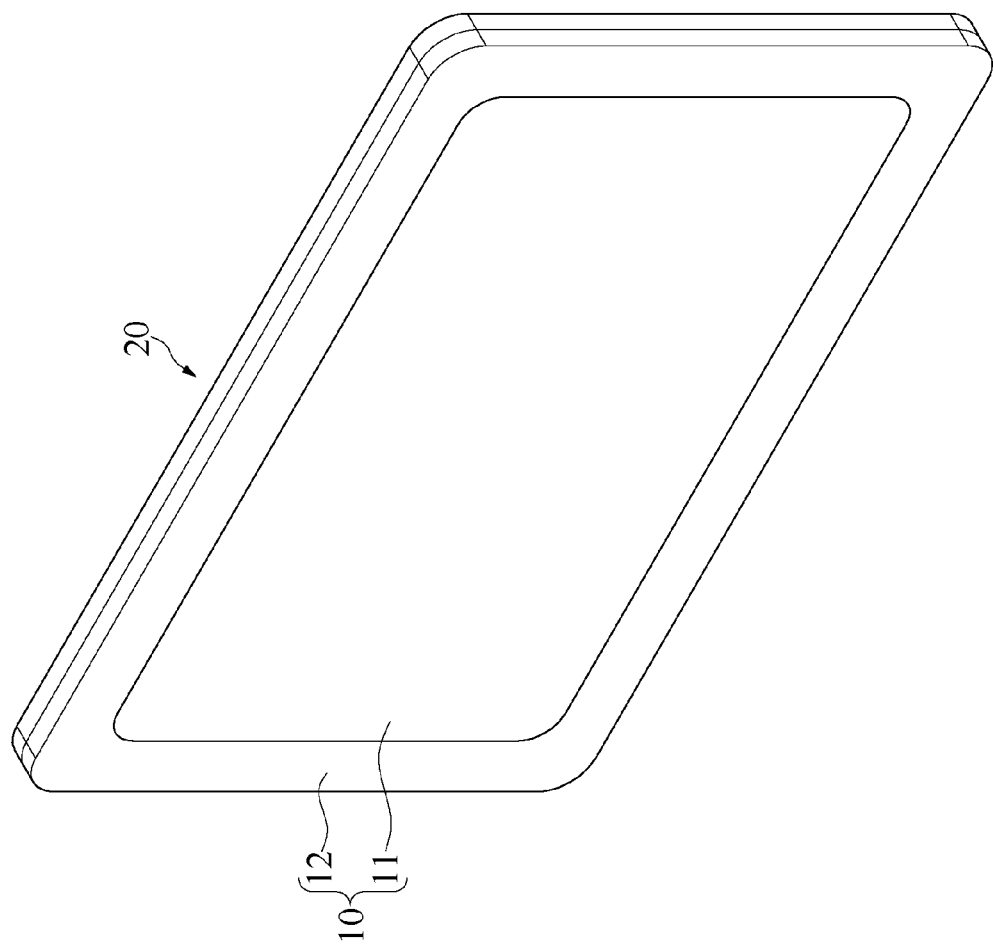
Figure 2:
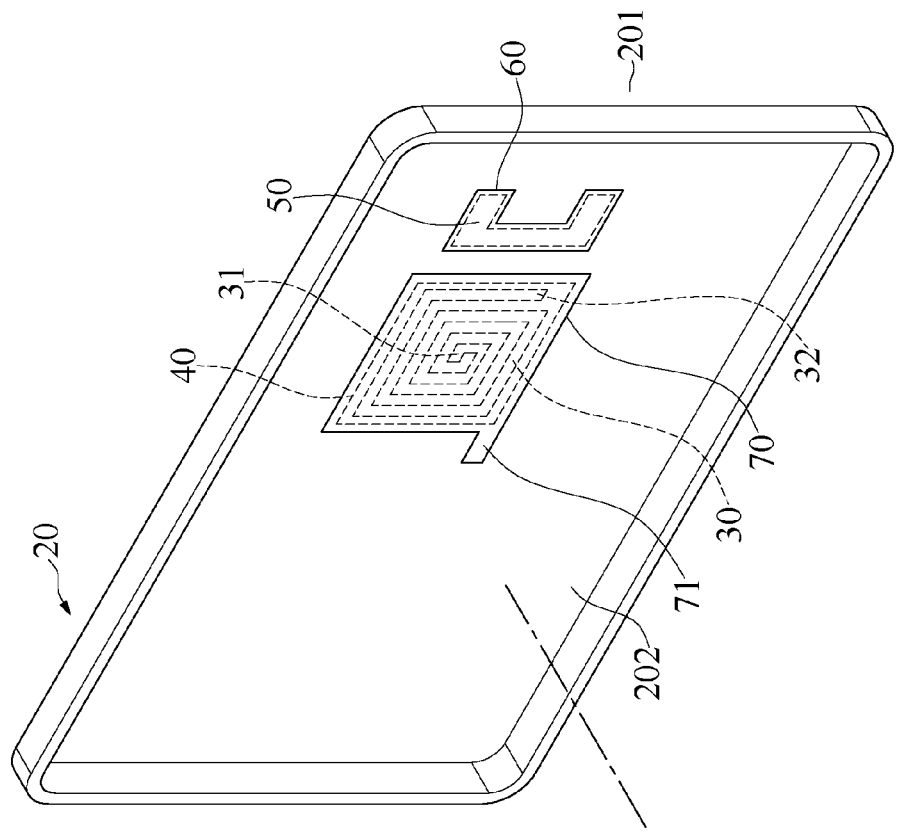
FIG. 2 is a schematic exploded diagram of an electronic device of the present invention.
Figure 3:
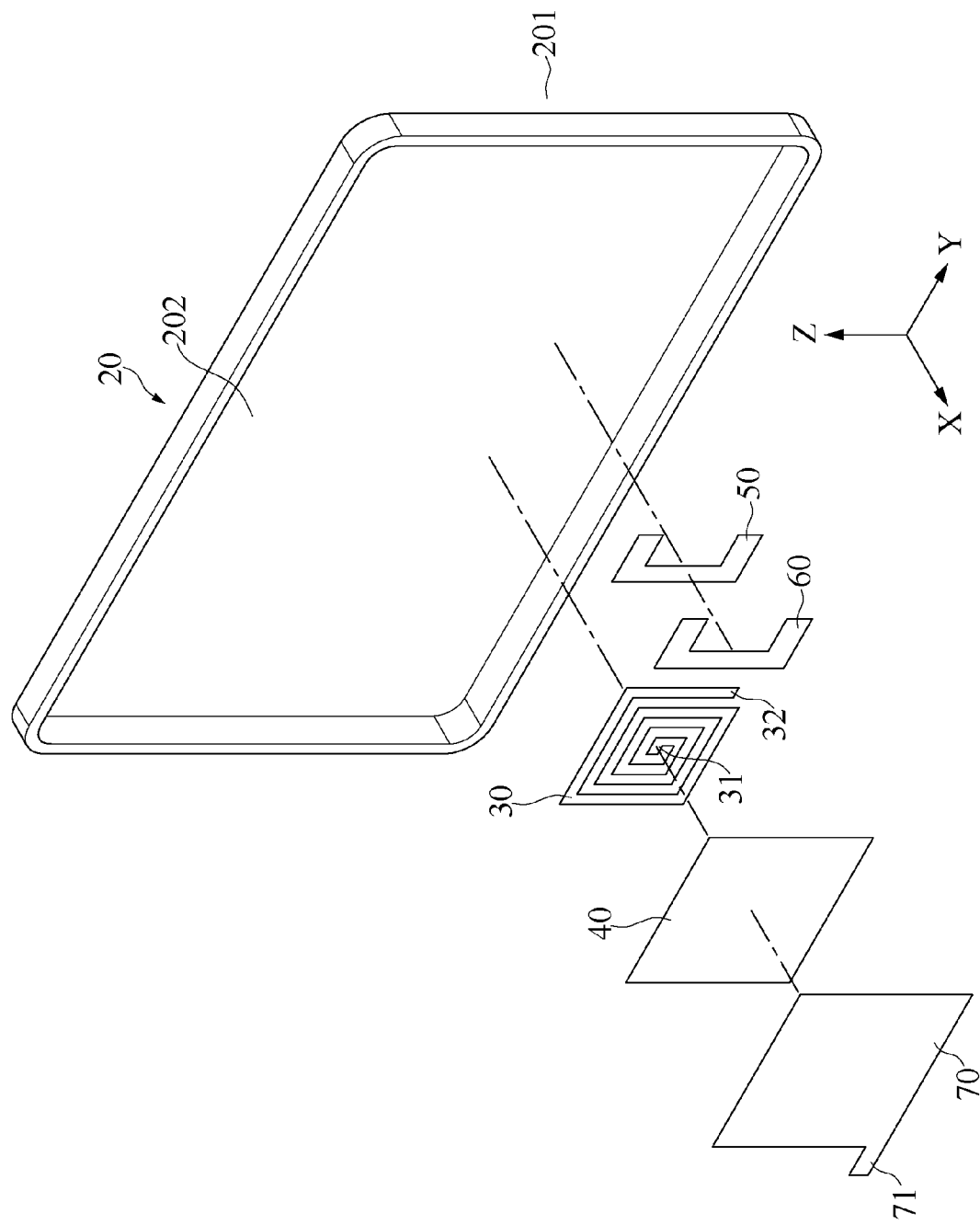
FIG. 3 is a schematic partial exploded diagram of an electronic device of the present invention.

Referring to FIG. 1 to FIG. 3 together, FIG. 1 is a schematic diagram of an electronic device of the present invention. FIG. 2 is a schematic exploded diagram of an electronic device of the present invention. FIG. 3 is a schematic partial exploded diagram of an electronic device of the present invention. An electronic device 100 of the present invention in a practical application may be, for example, a tablet computer (for example, a consumer tablet, an industrial tablet, and the like), a smart phone, or a laptop computer. No limitation is imposed herein.

The electronic device 100 includes a body 10, an insulation housing 20, an NFC antenna 30, a first insulation layer 40, a capacitive proximity sensor pad 50, a second insulation layer 60, and a conductive sheet 70. The body 10 may include a display screen 11, a frame 12, and a circuit board 13. The display screen 11 is configured to display scenes for a user to watch. The display screen 11 may be a touch screen. No limitation is imposed herein. The frame 12 surrounds the display screen 11, and is configured to protect the display screen 11. The circuit board 13 is disposed in the frame 12, and the circuit board 13 is correspondingly provided with many types of electronic components (for example, various microprocessors) corresponding to various functions of the electronic device 100.

The circuit board 13 is provided with an NFC antenna processing module 14, a capacitive proximity sensing module 15, and a processing unit 16. The NFC antenna processing module 14 is configured to cooperate with the NFC antenna 30 to receive or send a wireless signal. The capacitive proximity sensing module 15 is configured to cooperate with the capacitive proximity sensor pad 50 to detect a change in capacitance to determine whether an organism (for example, a human body) approaches the electronic device 100. The processing unit 16 is electrically connected to the NFC antenna processing module 14 and the capacitive proximity sensing module 15. The processing unit 16 herein, for example, may serve as a microprocessor, which controls the main operation of the electronic device 100, but is not limited thereto. Alternatively, the processing unit 16 may serve as a microprocessor, which merely processes a wireless signal.

The insulation housing 20 may be assembled to a side of the body 10 where the circuit board 13 is exposed. The insulation housing 20 is made, for example, of a plastic material, or of any non-conductive material. In a practical application, the insulation housing 20 is detachably disposed on one side of the body 10. For example, the insulation housing 20 may be fixed to the body 10 by a plurality of screws, but is not limited thereto. The insulation housing 20 may be fixed to the body 10 in a clamping manner or the like.

Figure 4:
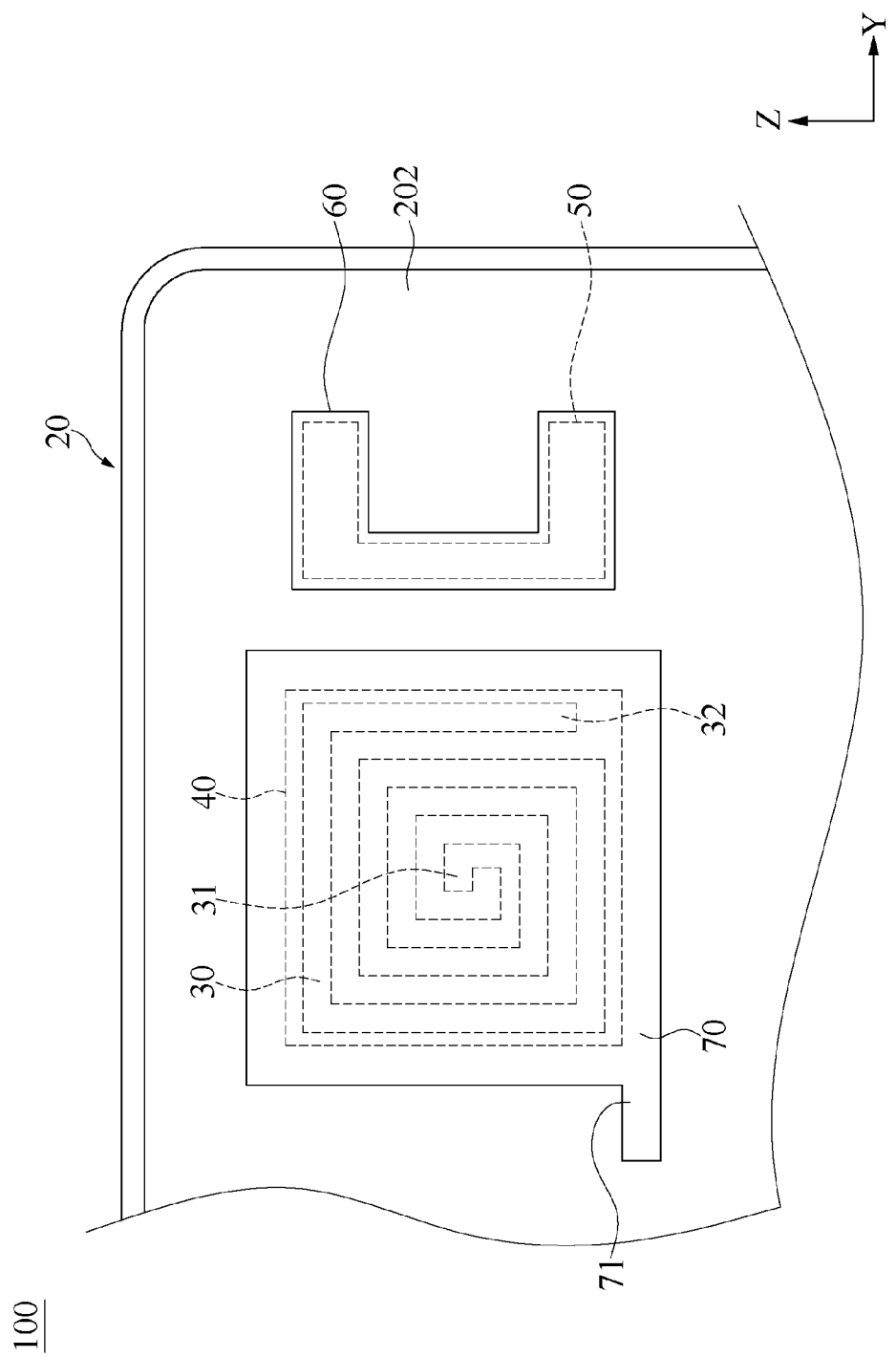
FIG. 4 is a schematic diagram of an inner side surface of an insulation housing of an electronic device of the present invention.

Referring to FIG. 2 to FIG. 4 together, FIG. 4 is a front view of an inner side surface of the insulation housing 20 of the electronic device 100. It should be noted that components, such as a related flexible flat cable, a metal wire, or a metal contact, configured to connect two feed terminals 31 and 32 of the proximity field communications antenna 30 to the circuit board 13 are not shown in FIG. 4. Components, such as a related flexible flat cable, a metal wire, or a metal contact, configured to connect the capacitive proximity sensing board 50 to the circuit board 13 are not shown in FIG. 4, either. The two wide surfaces of the insulation housing 20 opposite each other are defined as an outer side surface 201 and an inner side surface 202 respectively. When the insulation housing 20 is assembled on the side of the body 10, the outer side surface 201 is exposed to the outside, the inner side surface 202 is located inside the electronic device 100, and the inner side surface 202 is disposed, facing the circuit board 13.

The NFC antenna 30 is disposed on the inner side surface 202 of the insulation housing 20. The first insulation layer 40 is disposed on a side of the NFC antenna 30, opposite the other side of the NFC antenna 30 facing the insulation housing 20, (that is, the side, relatively away from the insulation housing 20, of the NFC antenna 30). In an actual application, the NFC antenna 30, for example, may be fixed to the inner side surface 202 of the insulated housing 20 in a manner such as adhesion. The first insulation layer 40 may be made of any non-conductive material, and the first insulation layer 40 may be adhered to the side of the NFC antenna 30, opposite the other side of the NFC antenna 30 facing the insulation housing 20. In an implementation, the NFC antenna 30, for example, may be made of a wound metal coil in a loop shape, and the operating frequency of the NFC antenna 30, for example, may be 13.56 MHz. Certainly, the shape and the operating frequency of the NFC antenna 30 may be changed according to requirements and are not limited by the shape and a value described above.

The first insulation layer 40 is a metal coil mainly configured to isolate the NFC antenna 30. Therefore, an area of the first insulation layer 40 is basically greater than an area of the NFC antenna 30, and the first insulation layer 40 may shield the metal coil of the NFC antenna 30. In a practical application, the first insulation layer 40, for example, may be sheet-like (as shown in FIG. 3), but is not limited thereto. In different applications, the first insulation layer 40 may be formed directly on a side of the metal coil of the NFC antenna 30 in a manufacturing process of the NFC antenna 30.

When the insulation housing 20 is assembled to the side of the body 10, the NFC antenna 30 is electrically connected to the NFC antenna processing module 14 disposed on the circuit board 13. In a practical application, the two feed terminals 31 and 32 of the NFC antenna 30 may be connected to corresponding contacts (not shown in the figure) of the NFC antenna processing module 14, for example, by using a flexible flat cable, a wire, or the like. In a specific application, the two feed terminals 31 and 32 of the NFC antenna 30 may be electrically connected to two contacts of the circuit board 13, and the NFC antenna processing module 14 is electrically connected to the two contacts through the circuit board 13. It should be noted that, the first insulation layer 40 does not block the electrical connection between the NFC antenna 30 and the NFC antenna processing module 14 disposed on the circuit board 13.

The capacitive proximity sensor pad 50 is disposed on the inner side surface 202 of the insulation housing 20 and is adjacent to the NFC antenna 30. The material of the capacitive proximity sensor pad 50 may be, for example, a metal material or any conductive material. When the insulation housing 20 is assembled to the side of the body 10, the capacitive proximity sensor pad 50 is electrically connected to the capacitive proximity sensing module 15 fixed to the circuit board 13. The capacitive proximity sensor pad 50 may be electrically connected to the capacitive proximity sensing module 15, for example, by using a flexible flat cable, a metal wire, or the like. The capacitive proximity sensor pad 50 may include a metal contact electrically connected to a corresponding contact of the circuit board 13 or a corresponding contact of the capacitive proximity sensing module 15 in an abutting manner.

When the capacitive proximity sensor pad 50 senses a change in capacitance within a predetermined range, the capacitive proximity sensing module 15 correspondingly generates a sensing signal. After receiving the sensing signal, the processing unit 16 may correspondingly regulate transmit power of a wireless communications module 17 down, to prevent the human body from being exposed to an environment with high-radiation electromagnetic waves.

The second insulation layer 60 is fixedly disposed on one side of the capacitive proximity sensor pad 50, opposite the other side of the capacitive proximity sensor pad 50 facing the insulation housing 20 (that is, the side, relatively away from the insulation housing 20, of the capacitive proximity sensor pad 50). The second insulation layer 60, for example, may be formed directly on the side of the capacitive proximity sensor pad 50 in the production process of the capacitive proximity sensor pad 50. Alternatively, the second insulation layer 60 may be a sheet-like structure, and is adhered to the side of the capacitive proximity sensor pad 50 or the like. It should be noted that, the second insulation layer 60 indicated herein does not block the electrical connection between the capacitive proximity sensor pad 50 and the capacitive proximity sensing module 15 disposed on the circuit board 13.

The conductive sheet 70 is disposed on a side of the first insulation layer 40, opposite the other side of the first insulation layer 40 facing the NFC antenna 30, (that is, the side, relatively away from the NFC antenna 30, of the first insulation layer 40), and the conductive sheet 70 and the NFC antenna 30 are electrically isolated from each other by the first insulation layer 40. An area of the conductive sheet 70 is greater than an area of the NFC antenna 30. Specifically, an orthographic projection of the NFC antenna 30 in a direction of the insulation housing 20 falls within an orthographic projection of the conductive sheet 70 in the direction of the insulation housing 20, and From a top view in a direction from the insulation housing 20 toward the body 10 (as shown in FIG. 5, that is, from a rear view of the electronic device 100), the NFC antenna 30 is located in an area of the conductive sheet 70.

It should be noted that because the first insulation layer 40 is disposed between the conductive sheet 70 and the NFC antenna 30, the NFC antenna 30 is located on the other side of the first insulation layer 40, and there is basically no conductive component disposed between the NFC antenna 30 and the insulation housing 20, the conductive sheet 70 basically does not interfere with a wireless signal of the NFC antenna 30.

Figure 5:
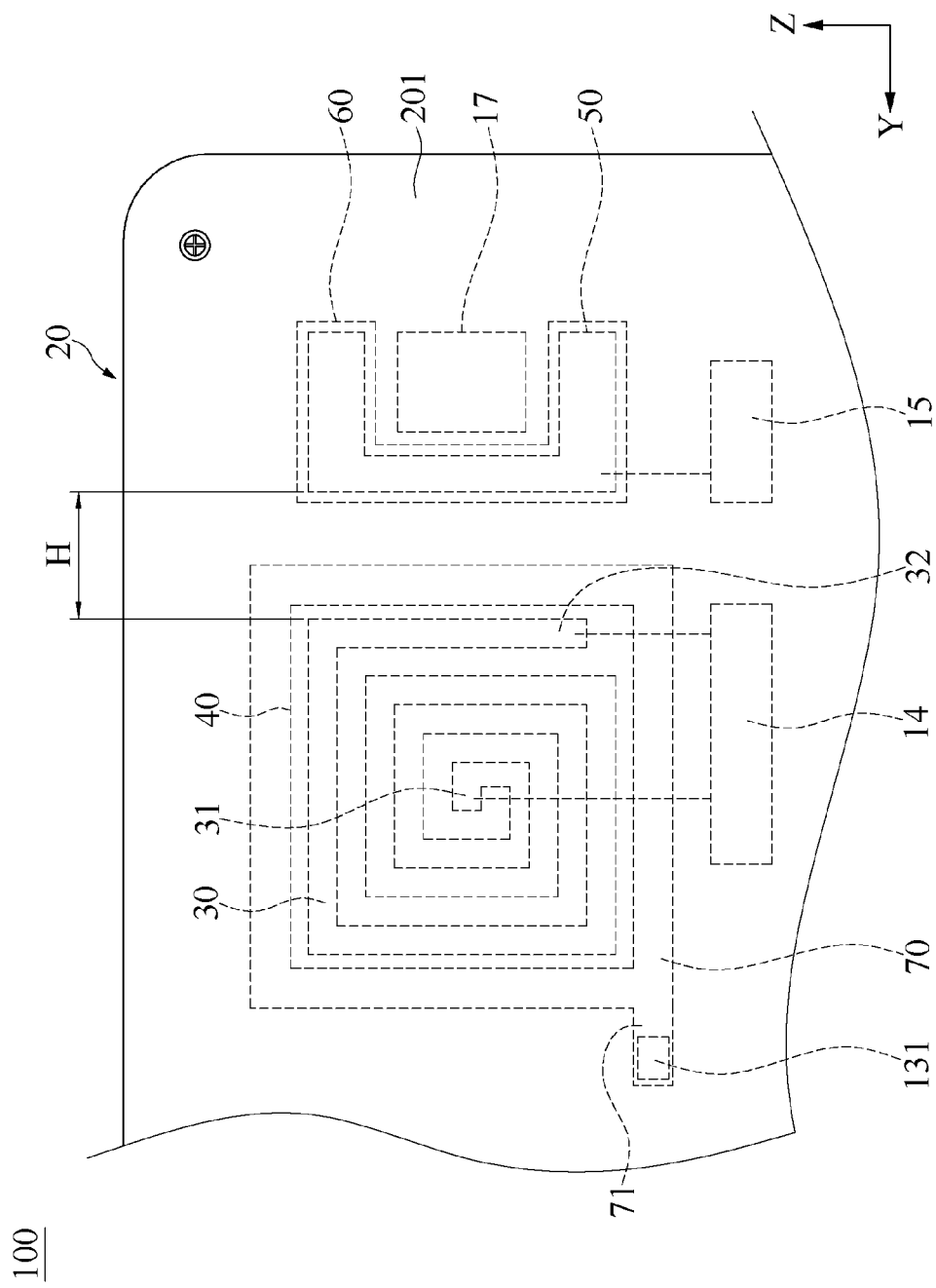
FIG. 5 is a rear view of an electronic device of the present invention.

As shown in FIG. 4 and FIG. 5, in this embodiment of the present invention, the conductive sheet 70 is provided with a grounded portion 71. When the insulation housing 20 is disposed on the side of the body 10, the grounded portion 71 of the conductive sheet 70 is connected to a grounded portion 131 of the circuit board 13, and the conductive sheet 70 becomes a ground plane. In a specific application, the grounded portion 71 of the conductive sheet 70 and the grounded portion 71 of the circuit board 13 may be in contact with each other by using a metal flat spring, but are not limited thereto. The shape and the position of the grounded portion 71 are not limited to those shown in the figure. The shape and the position of the grounded portion 131 of the circuit board 13 are not limited to those shown in the figure either.

As shown in FIG. 5, when the insulation housing 20 is assembled to the side of the body 10, the capacitive proximity sensor pad 50 surrounds at least three sides of the wireless communications module 17 on the circuit board 13. Specifically, the shape of the capacitive proximity sensor pad 50 is approximately a C shape, but the shape of the capacitive proximity sensor pad 50 is not limited thereto. The wireless communications module 17 may be, for example, a Wi-Fi antenna module, a 3G antenna communications module, a 4G antenna communications module, or a 5G antenna communications module.

In a practical application, when the capacitive proximity sensor pad 50 and the capacitive proximity sensing module 15 sense a change in capacitance in the surroundings, the processing unit 16 correspondingly lowers the output power of a radio frequency amplifier of the wireless communications module 17 to prevent a user from being exposed to an environment with high-radiation electromagnetic waves. In this way, the electronic device 100 can comply with, for example, the specification of the Federal Communications Commission (FCC) which regulates that a specific absorption rating (SAR) for a human body should be less than 1.6 W/kg and the specification of the Conformite Europeenne (CE) of European Union countries which regulates that an SAR for a human body should be less than 2.0 W/kg. In other words, when a user approaches the electronic device 100, and specifically to an area in which the wireless communications module 17 is disposed, the capacitive proximity sensor pad 50 senses the change in capacitance, and the processing unit 16 correspondingly controls the wireless communications module 17 to lower its output power, thereby reducing an SAR for a human body of the electronic device 100.

Based on the foregoing, the electronic device 100 of the present invention prevents a user from absorbing high-radiation electromagnetic waves when the user approaches the electronic device 100, Therefore, the capacitive proximity sensor pad 50 is disposed in the electronic device 100 and cooperates with the capacitive proximity sensing module 15 and the processing unit 16 to allow the wireless communications module 17 to lower its output power when the user approaches the electronic device 100. In addition, the electronic device 100 of the present invention is further provided with the NFC antenna 30 near the periphery of the capacitive proximity sensor pad 50. The user may transmit and receive a related wireless signal by using the NFC antenna 30.

Figure 6:
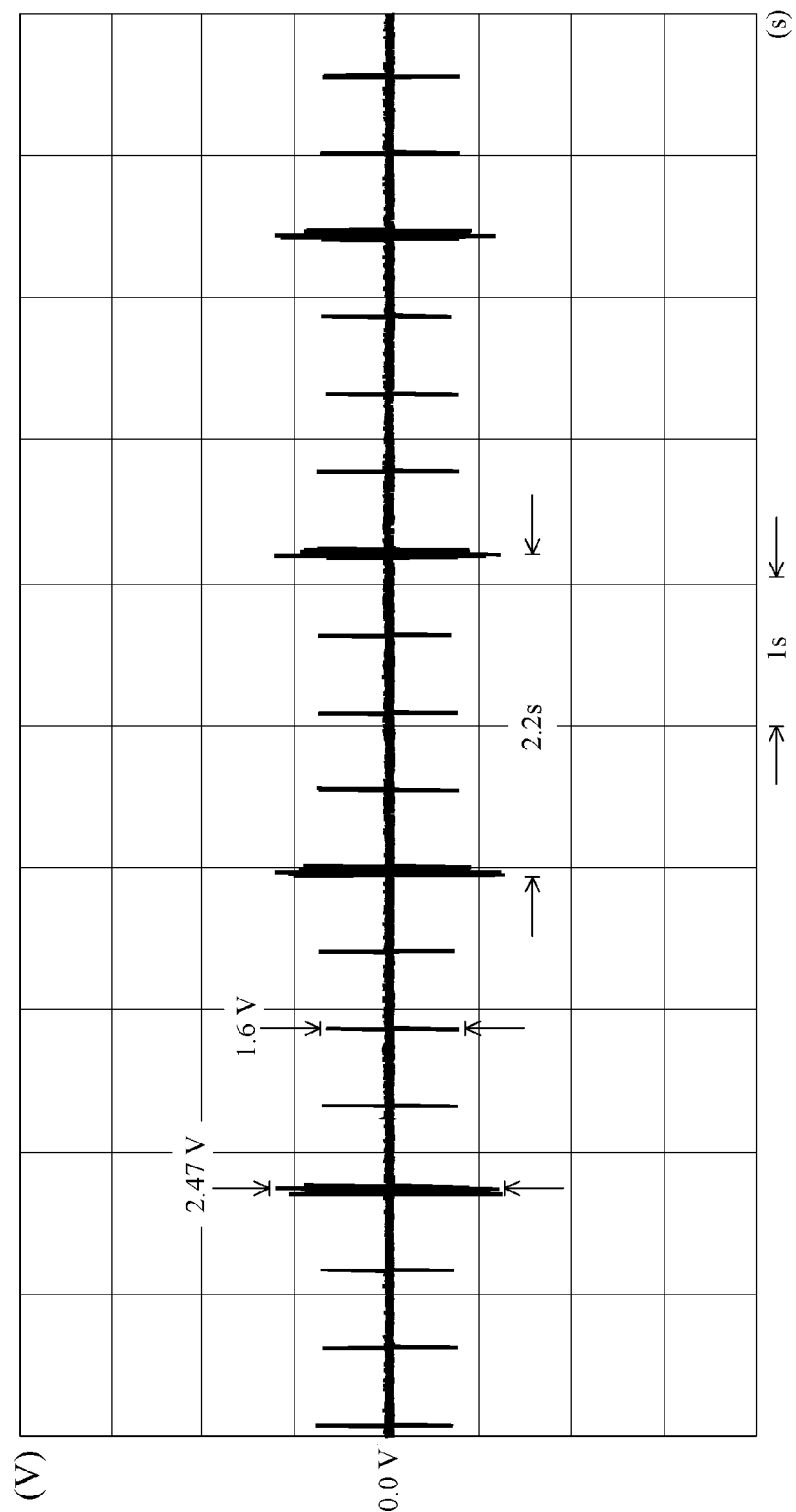
FIG. 6 is a waveform of an NFC antenna with an operating frequency of 13.56 MHz.
Figure 7:
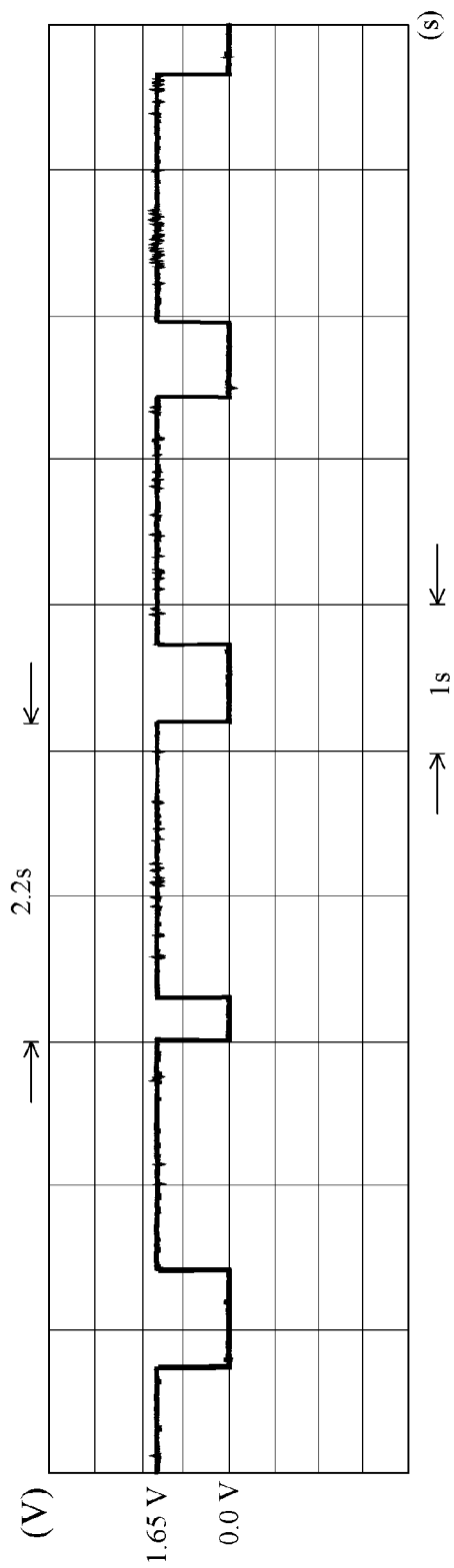
FIG. 7 is a waveform of an output signal of a capacitive proximity sensor when an electronic device of the present invention is not provided with a conductive sheet.

Referring to FIG. 6 and FIG. 7 together, FIG. 6 is an waveform of a pulse signal emitted by an NFC antenna 30 with an operating frequency of 13.56 MHz and measured by a digital oscilloscope (the model Lecroy 434 is used herein). FIG. 7 is an waveform of an output signal of a capacitive proximity sensor (including the capacitive proximity sensor pad 50 and the capacitive proximity sensing module 15) with an operating frequency of 125 KHz when the electronic device 100 of the present invention is deliberately not provided with the conductive sheet 70. As shown in FIG. 6, the NFC antenna 30 with an operating frequency of 13.56 MHz transmits the pulse signal of approximately 2.47 volts every 2.2 seconds, and the NFC antenna 30 also transmits three pulse signals of approximately 1.6 volts during a 2.2 second interval. As shown in FIG. 7, the output voltage of the capacitive proximity sensor with the operating frequency of 125 KHz decreases from 1.65 volts to 0 volts every 2.2 seconds. When the voltage of the output signal of the capacitive proximity sensor reaches 0 volts, the processing unit 16 may determine that an organism approaches the electronic device 100, and the processing unit 16 may control the wireless communications module 17 to lower its output power.

Based on the foregoing, in a specific experiment, when the electronic device 100 of the present invention is deliberately not provided with the conductive sheet 70, the output voltage of the capacitive proximity sensor is significantly affected by an electromagnetic pulse signal periodically and continuously emitted by the NFC antenna 30, and the capacitive proximity sensor periodically generates an erroneous output signal. That is, the processing unit 16 controls the wireless communications module 17 to lower its output power even if there is no the organism approaching the electronic device 100 without the conductive sheet 70. Therefore, the user may experience problems such as a lag of data transmission, and have poor product use experience.

Figure 8:
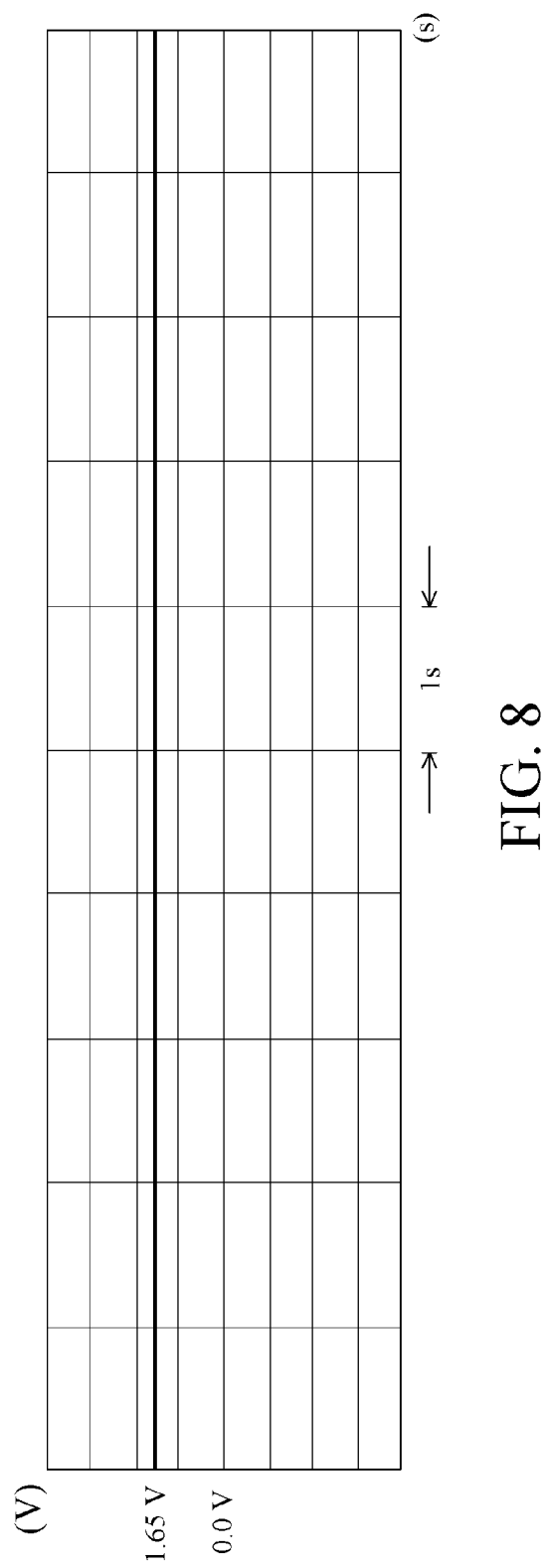
FIG. 8 is a waveform of an output signal of a capacitive proximity sensor when an electronic device of the present invention is provided with a conductive sheet.

FIG. 8 is a waveform of an output signal of a capacitive proximity sensor when an electronic device 100 of the present invention is provided with a conductive sheet 70, and no organism approaches the electronic device 100. It can be clearly seen that in FIG. 8 the output voltage of the capacitive proximity sensor does not have any fluctuation. That is, the capacitive proximity sensor is no longer affected by the pulse signal periodically emitted by the NFC antenna 30, and therefore, there is no signal fluctuation shown in FIG. 7 anymore. Accordingly, the electronic device 100 of the present invention may greatly reduce high-volt signal interference generated periodically by the adjacent NFC antenna 30 on the capacitive proximity sensor by disposition of the conductive sheet 70, thereby resolving the problem that the capacitive proximity sensor performs a false operation.

As mentioned above, the electronic device 100 of the present invention is provided with the conductive sheet 70, and the conductive sheet 70 is connected to the grounded portion of the circuit board 13. Therefore, when the NFC antenna 30 emits a high-volt pulse signal the conductive sheet 70 may lead some pulse signals to the grounded portion 131 of the circuit board 13. Therefore, the capacitive proximity sensor is less likely to be affected by the pulse signal emitted by the adjacent NFC antenna 30, thereby greatly reducing a probability that the capacitive proximity sensor performs a false operation.

Figure 9:
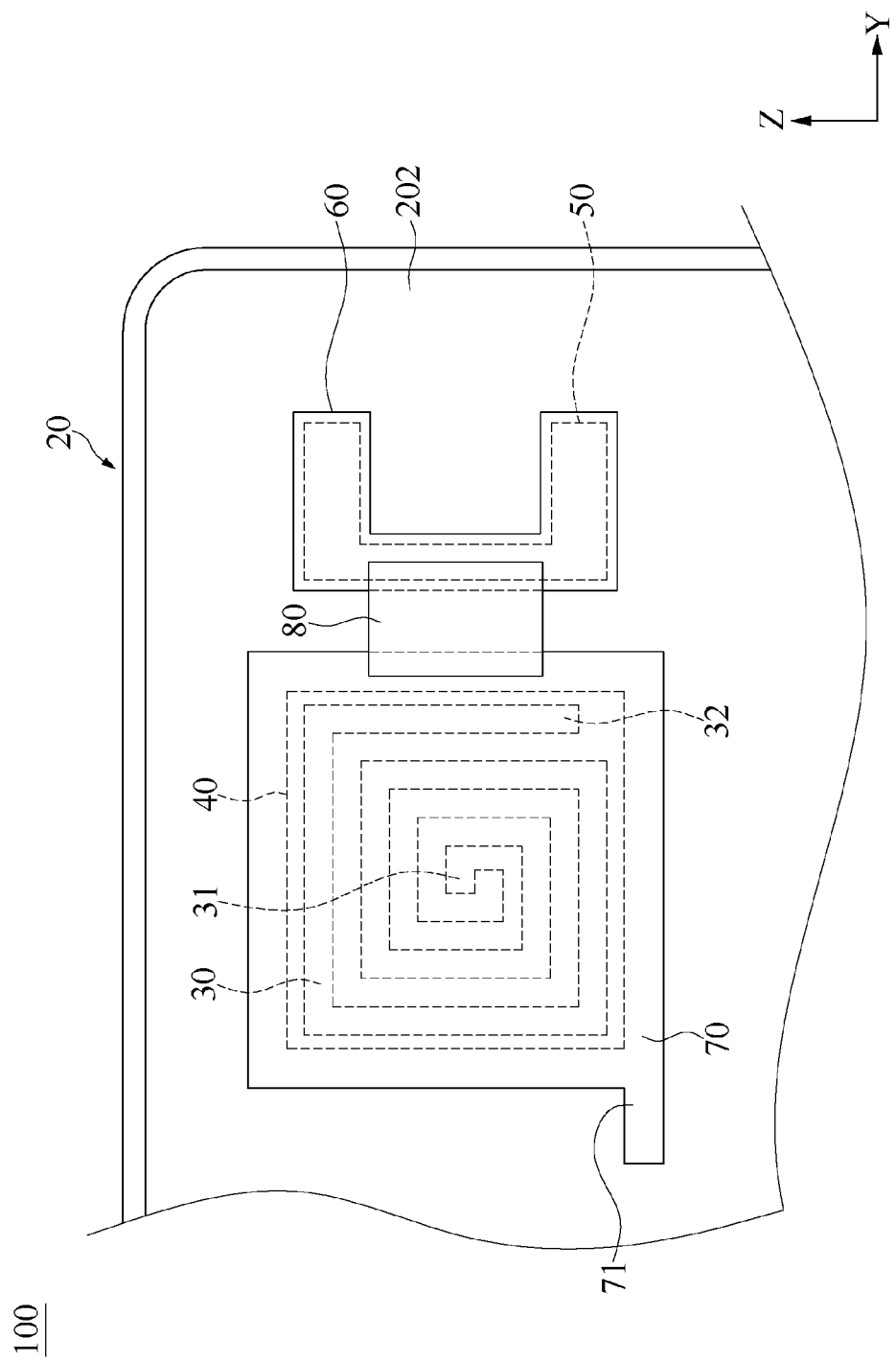
FIG. 9 is a schematic diagram of an embodiment of an electronic device of the present invention.

FIG. 9 is a schematic diagram of an embodiment of an electronic device of the present invention. As shown in the figure, a greatest difference between this embodiment and the foregoing embodiments is as follows: The electronic device 100 may further include an auxiliary conductive sheet 80. A part of the auxiliary conductive sheet 80 is disposed on a side of the conductive sheet 70, opposite the other side of the conductive sheet 70 facing the first insulation layer 40, and is electrically connected with the conductive sheet 70. The other part of the auxiliary conductive sheet 80 is disposed on the side of the second insulation layer 60, opposite the other side of the second insulation layer 60 facing the capacitive proximity sensor pad 50. More specifically, an orthographic projection of the capacitive proximity sensor pad 50 in a direction of the insulation housing 20 overlaps at least a part of an orthographic projection of the auxiliary conductive sheet 80 in the direction of the insulation housing 20.

In this embodiment of the present invention, the auxiliary conductive sheet 80 and the conductive sheet 70 may be connected by using any conductive adhesive. Therefore, the auxiliary conductive sheet 80 and the conductive sheet 70 are in electrically connected with each other. The size of the auxiliary conductive sheet 80 may be determined according to the size of the capacitive proximity sensor pad 50 and the size of the conductive sheet 70. As long as a part of the auxiliary conductive sheet 80 is connected to the conductive sheet 70, and the other part shields a part of the capacitive proximity sensor pad 50.

In a practical application, the auxiliary conductive sheet 80 may be made of the same material as the conductive sheet 70, but is not limited thereto. When the insulation housing 20 is assembled to the body 10, the conductive sheet 70 and the auxiliary conductive sheet 80 may be electrically connected to the grounded portion 131 of the circuit board 13. For example, the conductive sheet 70 and the auxiliary conductive sheet 80 may be electrically connected to the grounded portion 131 of the circuit board 13 through the grounded portion 71 of the conductive sheet 70, but are not limited thereto. Provided that the conductive sheet 70 and the auxiliary conductive sheet 80 can be electrically connected to the grounded portion 131 of the circuit board 13, the conductive sheet 70 or the auxiliary conductive sheet 80 may have any corresponding structure.

In a specific application, the placement of the auxiliary conductive sheet 80 in the electronic device 100 may greatly reduce interference of the pulse signal emitted by the NFC antenna 30 on the capacitive proximity sensor pad 50, thereby greatly reducing a probability that the capacitive proximity sensor performs a false operation, in particular, in a situation in which a shortest linear distance H (as shown in FIG. 5) between the NFC antenna 30 and the capacitive proximity sensor pad 50 is less than 2.5 centimeters.

The shape of the auxiliary conductive sheet 80, a shielded area of the capacitive proximity sensor pad 50, and the like may be changed according to practical requirements. In a practical experiment, the greater the area of the capacitive proximity sensor pad 50 is shielded by the auxiliary conductive sheet 80, basically, the more the interference of the pulsed signal emitted by the NFC antenna 30 on the capacitive proximity sensor pad 50 can be reduced.

It should be noted that, a single auxiliary conductive sheet 80 is taken as an example in the drawing of this embodiment. However, in a practical application, a quantity of the auxiliary conductive sheets 80 and the positions thereof relative to the capacitive proximity sensor pad 50 are not limited to those shown in the figure. In different applications, the conductive sheet 70 may alternatively be connected to more than two auxiliary conductive sheet 80.

Figure 10:
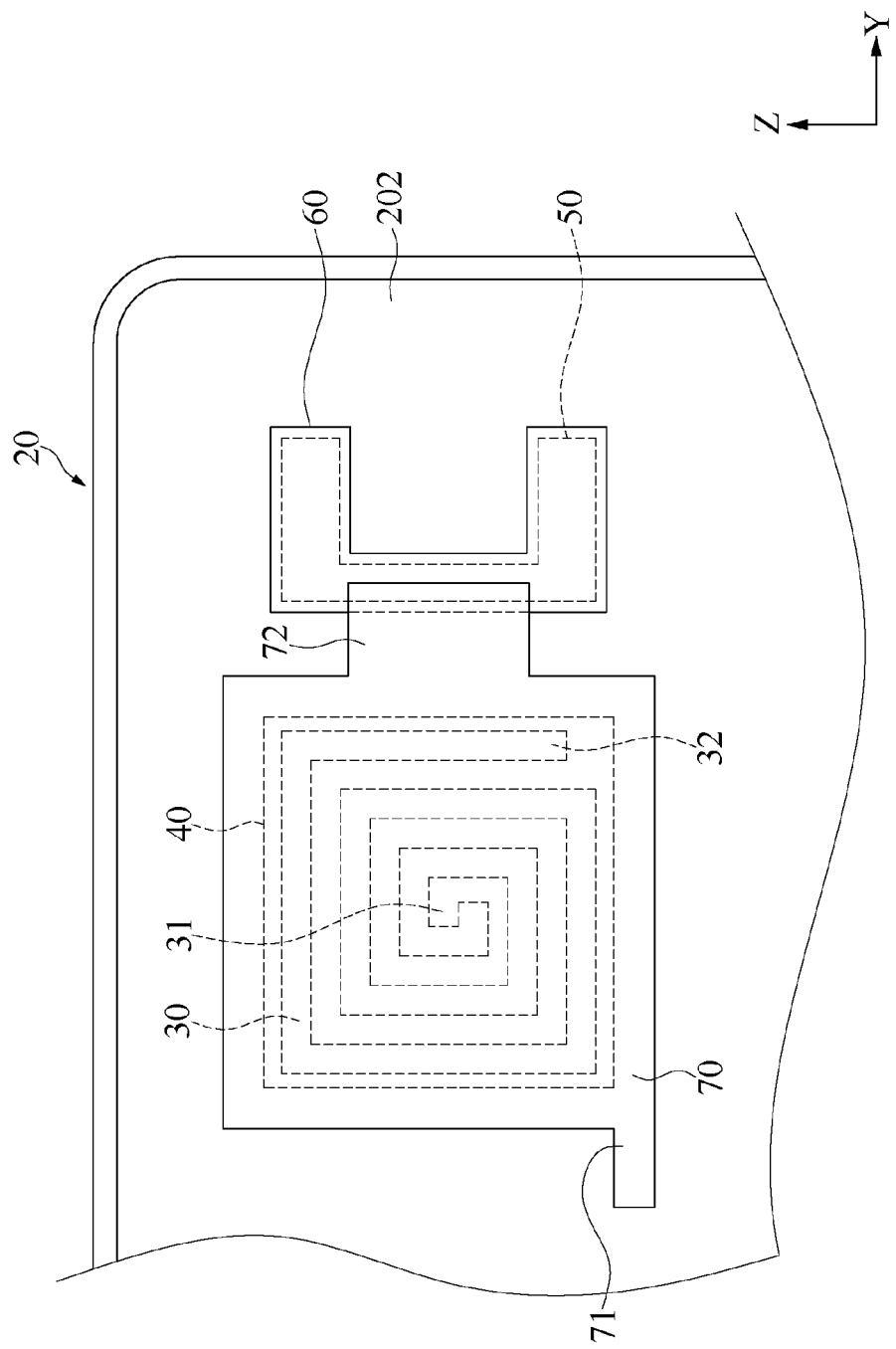
FIG. 10 is a schematic diagram of an embodiment of an electronic device of the present invention.

FIG. 10 is a schematic diagram of an embodiment of an electronic device of the present invention. As shown in the figure, the greatest difference between this embodiment and the foregoing embodiments is that: The conductive sheet 70 may include an extension portion 72, and the extension portion 72 and the conductive sheet 70 are integrally formed. The extension portion 72 is disposed on a side of the second insulation layer 60, opposite the other side of the second insulation layer 60 facing the capacitive proximity sensor pad 50 (that is, the side, relatively away from the capacitive proximity sensor pad 50, of the second insulation layer 60), and the extension portion 72 shields a part of the capacitive proximity sensor pad 50. More specifically, the orthographic projection of the capacitive proximity sensor pad 50 in the direction of the insulation housing 20 overlaps at least a part of an orthographic projection of the extension portion 72 in the direction of the insulation housing 20.

The function of the extension portion 72 indicated in this embodiment is the same as that of the auxiliary conductive sheet 80 indicated in the foregoing embodiments, and both are used to reduce interference of the pulse signal emitted by the NFC antenna 30 on the capacitive proximity sensor pad 50, thereby preventing the capacitive proximity sensor pad 50 from performing a false operation when there is no the organism approaching the electronic device 100. a single extension portion 72 formed by extending the conductive sheet 70 in the direction of the capacitive proximity sensor pad 50 is taken as an example in the drawing of this embodiment, but a quantity of the extension portions 72 and the positions of the extension portions 72 are not limited to those shown in the figure. In different applications, the conductive sheet 70 may include more than two extension portions 72.

Based on the foregoing, with regard to the electronic device of the present invention, through disposition of components such as the conductive sheet, the capacitive proximity sensor can still function normally even if the electronic device is equipped with the wireless communications antenna (such as Wi-Fi), and the capacitive proximity sensor, and the NFC antenna all disposed adjacent to the capacitive proximity sensor pad. The capacitive proximity sensor is less likely to be interfered with by the periodic pulse signal emitted by the NFC antenna.

The above are only preferred feasible embodiments of the present invention, and are not intended to limit the patent scope of the present invention. Any equivalent structural changes made based on the contents of the specification and the drawings of the present invention shall all fall within the protection scope of the present invention.

What is claimed is:

1. An electronic device, comprising:
    a body, comprising a circuit board;
    an insulation housing capable of being assembled on a side of the body, wherein the insulation housing comprises an inner side surface facing the circuit board and an outer side surface opposite the inner side surface;
    a near field communications antenna, disposed on the inner side surface of the insulation housing, wherein when the insulation housing is assembled on the body, the near field communications antenna is electrically connected to the circuit board;
    a first insulation layer, disposed on a side of the near field communications antenna, opposite the other side of the near field communications antenna facing the insulation housing;
    a capacitive proximity sensor pad, disposed on the inner side surface of the insulation housing and adjacent to the near field communications antenna, wherein when the insulation housing is assembled on the body, the capacitive proximity sensor pad is electrically connected to the circuit board;
    a second insulation layer, disposed on a side of the capacitive proximity sensor pad, opposite the other side of the capacitive proximity sensor pad facing the insulation housing; and
    a conductive sheet, disposed on a side of the first insulation layer, opposite the other side of the first insulation layer facing the near field communications antenna, wherein when the insulation housing is assembled on the body, the conductive sheet is electrically connected to a grounded portion of the circuit board, an area of the conductive sheet is greater than an area of the near field communications antenna, and the conductive sheet is configured to reduce interference between the near field communications antenna and the capacitive proximity sensor pad.

2. The electronic device according to claim 1, wherein the circuit board is provided with a near field communications antenna processing module and a capacitive proximity sensing module, and when the insulation housing is assembled on the body, the near field communications antenna is electrically connected to the near field communications antenna processing module, and the capacitive proximity sensor pad is electrically connected to the capacitive proximity sensing module.

3. The electronic device according to claim 1, wherein when the insulation housing is assembled on the body, the capacitive proximity sensor pad is disposed and surrounding at least three sides of a wireless communications module of the circuit board.

4. The electronic device according to claim 1, wherein a shortest linear distance between the near field communications antenna and the capacitive proximity sensor pad is less than 2.5 centimeters.

5. The electronic device according to claim 1, wherein the conductive sheet is further provided with an extension portion, and the extension portion is disposed on a side of the second insulation layer, opposite the other side of the second insulation layer facing the capacitive proximity sensor pad.

6. The electronic device according to claim 5, wherein an orthographic projection of the capacitive proximity sensor pad in a direction of the insulation housing overlaps at least a part of an orthographic projection of the extension portion in the direction of the insulation housing.

7. The electronic device according to claim 1, wherein the electronic device further comprises an auxiliary conductive sheet, a part of the auxiliary conductive sheet is fixedly disposed on the conductive sheet and is in electrical connection with the conductive sheet, and a part of the auxiliary conductive sheet is disposed on a side of the second insulation layer, opposite the other of the second insulation layer facing the capacitive proximity sensor pad.

8. The electronic device according to claim 7, wherein an orthographic projection of the capacitive proximity sensor pad in a direction of the insulation housing overlaps at least a part of an orthographic projection of the auxiliary conductive sheet in the direction of the insulation housing.

9. The electronic device according to claim 1, wherein an orthographic projection of the near field communications antenna in a direction of the insulation housing falls within an orthographic projection of the conductive sheet in the direction of the insulation housing.

10. The electronic device according to claim 1, wherein the insulation housing is detachably fixed to the side of the body.

* * * * *